(12) United States Patent
Verschueren et al.

(10) Patent No.: US 6,699,640 B2
(45) Date of Patent: Mar. 2, 2004

(54) METHOD OF MAKING LITHOGRAPHIC PRINTING PLATE BY INKJET PRINTING

(75) Inventors: Eric Verschueren, Mortsel (BE); Luc Leenders, Herentals (BE); Joan Vermeersch, Deinze (BE); Ludo Joly, Hove (BE)

(73) Assignee: AGFA-Gevaert (BE)

( * ) Notice: Subject to any disclaimer, the term of this patent is extended or adjusted under 35 U.S.C. 154(b) by 219 days.

(21) Appl. No.: 09/911,998

(22) Filed: Jul. 24, 2001

(65) Prior Publication Data

US 2002/0031724 A1 Mar. 14, 2002

Related U.S. Application Data

(60) Provisional application No. 60/234,212, filed on Sep. 20, 2000.

(30) Foreign Application Priority Data

Jul. 31, 2000 (EP) .............................. 00202700

(51) Int. Cl.⁷ .............................. G03F 7/24; G03F 7/16; G03F 7/38; G03C 7/18
(52) U.S. Cl. ...................... 430/302; 430/935; 430/944
(58) Field of Search ................... 430/302, 935, 430/944; 347/102, 5, 20, 40, 55, 71, 73, 54, 95, 96

(56) References Cited

U.S. PATENT DOCUMENTS

| 5,130,726 A | * | 7/1992 | Fukushima et al. ......... 347/102 |
| 5,495,803 A | * | 3/1996 | Gerber et al. ............. 101/401.1 |
| 5,501,150 A | * | 3/1996 | Leenders et al. ........... 101/466 |
| 5,871,879 A | | 2/1999 | Verlinden et al. |
| 5,952,136 A | * | 9/1999 | Daems et al. ................. 430/22 |
| 5,966,154 A | * | 10/1999 | DeBoer ....................... 347/82 |
| 6,025,928 A | * | 2/2000 | Takemura et al. ........... 358/1.3 |
| 6,044,762 A | * | 4/2000 | DeBoer et al. ............. 101/466 |
| 6,092,890 A | * | 7/2000 | Wen et al. .................. 347/101 |
| 6,131,514 A | * | 10/2000 | Simons ....................... 101/466 |
| 6,164,757 A | * | 12/2000 | Wen et al. .................... 347/43 |
| 6,180,325 B1 | * | 1/2001 | Gelbart ....................... 430/397 |
| 6,341,859 B1 | * | 1/2002 | Wen et al. .................. 347/101 |
| 6,358,668 B1 | * | 3/2002 | Leenders et al. ......... 430/271.1 |
| 6,408,755 B1 | * | 6/2002 | Meisters et al. ............ 101/478 |
| 6,428,862 B1 | * | 8/2002 | Noguchi ..................... 427/511 |
| 6,454,405 B1 | * | 9/2002 | Stowe ......................... 347/102 |
| 6,457,413 B1 | * | 10/2002 | Loccufier et al. ........... 101/466 |
| 6,523,472 B1 | * | 2/2003 | Loccufier et al. ........... 101/466 |
| 6,526,886 B2 | * | 3/2003 | Loccufier et al. ........... 101/466 |
| 2002/0043171 A1 | * | 4/2002 | Loccufier et al. ........ 101/463.1 |
| 2002/0065335 A1 | * | 5/2002 | Noguchi et al. ............... 522/84 |
| 2002/0109763 A1 | * | 8/2002 | Loccufier et al. .............. 347/96 |
| 2002/0148375 A1 | * | 10/2002 | Verschueren et al. .... 101/450.1 |

FOREIGN PATENT DOCUMENTS

| DE | 3911934 A | 10/1990 | |
| DE | 4339493 A | 5/1994 | |
| EP | 773113 A1 | * 5/1997 | ............ B41M/5/36 |
| GB | 2272866 A | 6/1994 | |
| WO | WO 9411191 A | 5/1994 | |
| WO | WO 9959826 A | 11/1999 | |

OTHER PUBLICATIONS

European Search Report (Dec. 2000).

* cited by examiner

Primary Examiner—Janet Baxter
Assistant Examiner—Amanda C. Walke
(74) Attorney, Agent, or Firm—Leydig, Voit & Mayer, Ltd.

(57) ABSTRACT

A direct-to-plate method for obtaining a high quality lithographic printing plate is disclosed. The method comprises the application of a continuous layer of a radiation sensitive solution onto a lithographic substrate by means of an ink-jet printhead. Hereby waste of coating solution and contamination of the environment are avoided.

10 Claims, 1 Drawing Sheet

METHOD OF MAKING LITHOGRAPHIC PRINTING PLATE BY INKJET PRINTING

CROSS-REFERENCE TO RELATED APPLICATIONS

This application claims the benefit of U.S. Provisional Application No. 60/234,212 filed on Sep. 20, 2000, which is incorporated by reference.

FIELD OF THE INVENTION

The present invention relates to a direct-to-plate method for making a heat-sensitive high quality lithographic printing plate by means of an ink-jet printhead.

BACKGROUND OF THE INVENTION

Lithography is the process of printing from specially prepared surfaces, some areas of which are capable of accepting lithographic ink, whereas other areas, when moistened with water, will not accept the ink. The areas, which accept ink, form the printing image areas and the ink-rejecting areas form the background areas.

In the art of photolithography, a photographic material is made image-wise receptive to oily or greasy ink in the photo-exposed (negative working) or in the non-exposed areas (positive working) on a hydrophilic background.

In the production of common lithographic plates, also called surface litho plates or planographic printing plates, a support that has affinity to water or obtains such affinity by chemical treatment is coated with a thin layer of a photo-sensitive composition. Coatings for that purpose include light-sensitive polymer layers containing diazo compounds, dichromate-sensitized hydrophilic colloids and a large variety of synthetic photopolymers. Particularly diazo-sensitized systems are widely used. Upon image-wise exposure of the light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive.

Heat-sensitive imaging elements having an image forming layer comprising hydrophobic thermoplastic polymer particles dispersed in a water or alkali soluble or swellable resin and a compound capable of converting light into heat, are disclosed in e.g. EP-A-770 494, EP-A-770 495, EP-A-770 496, EP-A-770 497, EP-A-773 112, EP-A-773 113, EP-A-774 364, EP-A-800 928, EP-A-96 202 685, EP-A-96 203 003, EP-A-96 203 004 and EP-A-96 203 633. In most cases carbon black or an IR-dye are mentioned as the compound capable of converting light into heat.

In order to prepare an imaging element as described above, that is processable on the press, preferably IR-absorbing compounds are used. Both carbon black and IR-absorbing dyes or pigments can be used.

The coatings which are used for the preparation of lithographic printing plates are mostly applied with coating techniques such as dipcoating, cascade coating and curtain coating. When the coating proceeds on the press, spray techniques are very often used. The term "spray" means a method comprising spraying an aqueous solution or dispersion of a resin (coating solution) by a spraying device to atomize the coating solution and adsorbing and coating the coating solution sprayed onto a substrate. Spray techniques for applying layers on a substrate that is placed on a printing press are disclosed in e.g., U.S. Pat. No. 4,626,484, EP-A-818 711, U.S. Pat. No. 5,713,287, etc.

Several spraying techniques are known in the art: the air-spraying method comprises using a compressed air as spraying manner. The airless spraying method (liquid pressure spraying method) comprises spraying the coating solution by applying high pressure to the coating solution. The electrostatic spraying method comprises spraying the coating solution by electrostatic force. The electrostatic coating method is advantageous to increase adhesion efficiency of the resin in the coating solution and comprises employing an earthed article to be coated as an anode and a coating solution spraying device as a cathode, forming an electrostatic field between the anode and the cathode by applying high negative voltage, negatively charging the resin particles and adsorbing the resin particles on the article to be coated with good efficiency.

The use of airless spray techniques, however, for applying lithographic coating solutions makes it quite difficult to achieve high cosmetic quality (mainly evenness of the coating without stripes or bands) of the end product. The conditions for lithographic materials of high quality (thermal printing plates processable as well as not processable on-press) where high resolution, sensitivity and reproducing characteristics are required, are very high with relation to the cosmetic quality of said printing plate. This cosmetic quality can be translated as the presence of lines, the general evenness and the presence of a mottle pattern.

Air assisted spraying of lithographic coating solutions improves the cosmetic quality of the end product. Lithographic printing plates prepared by using this technique are described in EP-A 1084380 and EP-A 1084862 both filed on 15.09.1999. However, with this technique the coating solution is highly atomized resulting in a low yield of coating solution on the lithographic substrate since up to 50% of the atomized coating solution is wasted into the environment. Furthermore there is a high risk of contaminating printing press elements such as ink rollers, imaging units, cleaning units.

Thus a technique for applying layers on a substrate that is placed on a printing press that makes it possible to have a layer without mottle, banding and that does not soil the printing press is still highly desirable.

SUMMARY OF THE INVENTION

It is an object of the present invention to provide a direct-to-plate method for obtaining a high quality lithographic printing plate avoiding waste of coating solution and contamination of printing press elements. It is also an object of the present invention to provide a direct-to-plate method wherein the lithographic substrate can be reused.

The above objects are obtained by the method defined in claim 1.

The high quality lithographic printing plate of the present invention can be obtained by applying a continuous layer of a radiation sensitive solution onto a lithographic substrate by means of an ink-jet printhead whereby small drops of coating solution are jetted directly onto the lithographic substrate. Hereby no coating solution is wasted into the environment. Furthermore there is no risk of contaminating other elements of the printing press such as the ink rollers or the imaging unit.

Further advantages and preferred embodiments of the present invention will become apparent from the description hereinafter.

DETAILED DESCRIPTION OF THE INVENTION

Figure 1:
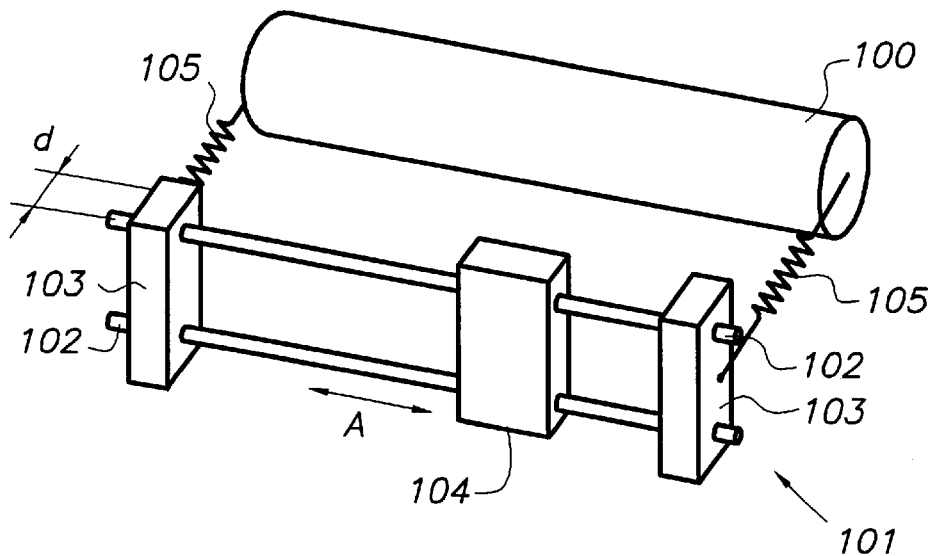
FIG. 1 shows schematically a possible placement of an ink-jet printhead in the vicinity of the part of the printing press carrying a lithographic substrate.

According to the present invention, a direct-to-plate high quality lithographic printing plate can be obtained by applying a continuous layer of a radiation sensitive solution onto a lithographic substrate by means of an ink-jet printhead.

Any type ink-jet printhead known in the art can be used in the method of this invention. Ink-jet printing proceeds basically by two techniques: continuous ink-jet and drop-on-demand ink-jet. In the method of this invention preferably printheads for continuous ink-jet are used. One of the advantages of these printheads are the extremely high speeds (speeds up to 300 m/min. are known in the art). In general, continuous drop stream generators comprise a nozzle, or array of nozzles, through which liquid is forced under pressure in a cylindrical stream. Such a cylindrical stream is unstable and will break up into a series of drops. If the stream is subject to a vibration of frequency near that corresponding to the fastest growing natural disturbance within the stream, the stream can be broken up by this vibration. In this mode, the stream forms a series of drops, each of volume equal to a cylindrical section of the stream, which will be the length of the impressed vibration wavelength. Typical continuous ink-jet printers are described in, e.g., EP-A-1 013 458, EP-A-1 013 438, EP-A-1 013 425, etc. Continuous ink-jet printheads such as those present in VersaMark ink-jet printers (available from Scitex Digital Printing) can be used.

Also on-demand ink-jet printing can be used. On-demand generators can be of an electrostatically controlled type wherein a drop is formed at a nozzle under low pressure (so that surface tension forces retain it) and released by application of a high voltage between the drop meniscus and a controlling electrode. On-demand generators also can be of the pressure-pulsed type which utilize a transducer element, for example, a piezoelectric crystal, that is selectively energized to generate compressive force on a body of liquid to thus propel a drop of the liquid through an orifice to a deposition zone. Preferred are piezo-electric drop-on-demand printheads as described in U.S. Pat. No. 5,855,713, WO-A-99 19147, WO-A-99 1284 and WO-A-95 18717. Typical useful drop-on-demand piezo ink-jet printheads are, e.g., XAARJET 500 having a printing width of 70 mm with 500 nozzles. XAARJET 64 having a width of 8.6 mm and XAARJET 128 having a width of 17.4 mm. Xaarjet is a trade name of XAAR pcl of the UK.

Since the ink-jet printheads in the method of this invention are used to apply an even layer of a coating solution, there is no need for image-wise controlling the nozzles, this means that both the construction and the drivers of the printhead can greatly be simplified when compared to image-wise ink-jet printing.

The nozzles in the nozzle array of the ink-jet printers for use in this invention can have a diameter between 50 and 1000 $\mu$m, preferably between 100 and 500 $\mu$m. The pitch of the nozzles in the nozzle array can also vary between the same values. Preferably the nozzle array comprises two rows, wherein the nozzles of one row are placed so that it has to be exactly in the gap between two nozzles of the other row. This makes it possible to evenly apply the layer even when nozzles of 500 $\mu$m or more are used with a pitch of 500 $\mu$m or more. The distance (d) between the ink-jet printhead and the lithographic substrate is depended on the distance between the nozzles (the pitch) and the diameter of the nozzles. The distance can be kept quite small (in the order of 100 to 5000 $\mu$m), which has the advantage that the means for applying layers on a substrate that is placed on a printing press can be made very compact. Since the distance (d) is rather small and the cylinder with the lithographic substrate very often has a kind of wobble in the same range as the distance, it is preferred to add means for keeping this distance (d) constant. This can be realized by providing the ink-jet printhead with spacing means which are mounted on the printhead by resilient means such as springs, coil springs, rubber bands etc. The main advantage of keeping the distance (d) constant is that the homogeneity of the layer that is applied is much larger and that no banding is present.

The printhead for use in this invention can be construed for shuttling over the width of the lithographic substrate. In FIG. 1, such a construction is schematically shown. On a cylinder (100) a lithographic substrate is present. This lithographic substrate may be a plate cylinder of a rotary printing press as well as a plate or a sleeve mounted on a plate cylinder of a rotary press. On a frame (101) with bars (102) and supporting means (103) a shuttle with an ink-jet printhead is mounted in such a way that it can be moved back and forth in the direction of arrow A (the means to move the shuttle). The supporting means (103) of the frame serve in this case also as spacers for keeping the frame at a constant distance (d) from the cylinder (100). To realize this the supporting means (103) are brought in contact with the outermost edges of the cylinder and kept there by resilient means, in the figure spring coils (105). By doing so the useful width of the lithographic substrate is slightly diminished on the edges, but the advantages that accompany the keeping of the distance (d) constant outweigh this possible (small) problem.

Figure 2:
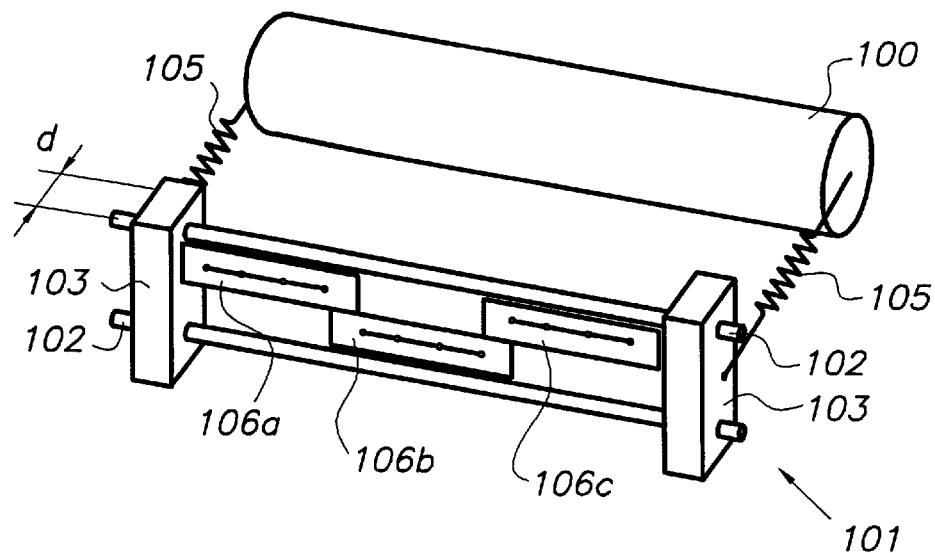
FIG. 2 shows schematically another possible placement of an ink-jet printhead in the vicinity of the part of the printing press carrying a lithographic substrate.

The ink-jet printhead of this invention is not necessarily placed on a shuttle; it is possible to mount on the frame several printheads in a staggered way, so that the sum of the printing width of each separate printhead equals the useful width of the lithographic substrate. In this case the ink-jet printheads are fixed and do not have to move back and forth over the width of the lithographic substrate. In FIG. 2 such an arrangement is shown: all numerals are the same as in FIG. 1, only the shuttle (104) is replaced by three ink-jet printheads (106a, 106b and 106c) placed on the frame (102) in a staggered way. Ways and means to place ink-jet printheads in a staggered way have been disclosed in, e.g., U.S. Pat. No. 4,922,271, U.S. Pat. No. 940,998 and U.S. Pat. No. 5,428,375. A combination of a shuttle with staggered printheads on the shuttle is also a possible implementation for an arrangement to implement the method of this invention.

The radiation sensitive solution used in the present invention preferably contains hydrophobic thermoplastic polymer particles having an average particle size between 40 nm and 2000 nm, and more preferably between 40 nm to 200 nm dispersed in a hydrophilic binder. Furthermore the polymer particles preferably have a coagulation temperature above 50° C. and more preferably above 70° C. There is no specific upper limit to the coagulation temperature of the polymer particles, however the temperature should be sufficiently below the decomposition temperature of the polymer particles. Preferably the coagulation temperature is at least 10° C. below the temperature at which the decomposition of the polymer particles occurs. Preferred examples of thermoplastic hydrophobic polymer particles for use the present invention have a Tg above 80° C. The weight average molecular weight of the polymers may range from 5,000 to 5,000,000 g/mol. Preferably the polymer particles are selected from the group consisting of polyvinyl chloride, polyvinylidene chloride, polyesters, polyurethanes, polyacrylonitrile, polyvinyl carbazole etc., and copolymers or mixtures thereof. The most preferred examples are polystyrene and polymethylmethacrylate or copolymers thereof.

Suitable hydrophilic binders for use in the present invention are preferably water-soluble (co)polymers for example synthetic homo- or copolymers such as polyvinylalcohol, a poly(meth)acrylic acid, a poly(meth)acrylamide, a polyhydroxyethyl(meth)acrylate, a polyvinylmethylether or natural binders such as gelatin, a polysaccharide such as e.g. dextran, pullulan, cellulose, arabic gum, alginic acid, inuline or chemically modified inuline.

The lithographic substrate used in the present invention can be a flexible support such as paper or plastic film, preferably provided with a crosslinked hydrophilic layer. More preferably a metal support is used such as aluminum having a hydrophilic surface e.g. electrochemically and/or mechanically grained and anodized aluminum. The lithographic substrate can be a sheet-like material such as a plate but, alternatively, the radiation sensitive solution may be applied directly to the plate cylinder of a rotary printing press, said cylinder thereby acting as the substrate. The lithographic substrate can also be a seamless sleeve printing plate, obtained by e.g. soldering a plate into a cylindrical form by means of a laser. The sleeve can then be slid around the plate cylinder instead of mounting a conventional printing plate. More details on sleeves are given in "Grafisch Nieuws", 15, 1995, page 4 to 6. Image-wise exposure according to the present invention is preferably an image-wise scanning exposure involving the use of a laser or L.E.D. Preferably used are lasers that operate in the infrared or near-infrared, i.e. wavelength range of 700–1500 nm. Most preferred are laser diodes emitting in the near infrared. Furthermore according to the present invention, the laser used for the image-wise exposure can also be mounted on the shuttle which carries the ink-jet printhead so that application of the radiation sensitive solution and image-wise exposure can be performed during the same pass of the shuttle. In the above-described system the laser will be much less contaminated during the application of the radiation sensitive solution than in a system wherein the ink-jet printhead is replaced by a spraying device. In the latter the coating solution is highly atomized which increases the chance of contaminating the laser.

The above-described steps of the method of the present invention are preferably performed on-press. After image-wise exposure printing is started by supplying ink and fountain solution.

After printing, the ink accepting areas are removed from the substrate by applying a cleaning liquid. Suitable cleaning liquids and methods for removing the ink-accepting areas are described in EP-A-00 200176, EP-A-00 200177, EP-A-00 200178 all filed on Jan. 18, 2000. After cleaning, the substrate can be reused by repeating the above described steps of the method of the present invention e.g. applying a continuous layer of radiation sensitive solution, image-wise exposing and applying ink and fountain solution.

EXAMPLES

Preparation of Spray Solution

A 2.61% wt solution in water was prepared by mixing a polystyrene latex, a heat-absorbing compound (I) and Glascol E15 (a polyacrylic acid commercially available from N.V. Allied Colloids Belgium). After spraying and drying, the resulting layer contained 75% W/W of the polystyrene latex, 10% of the heat-absorbing compound (I) and 15% W/W of Glascol E15.

Formula (I)

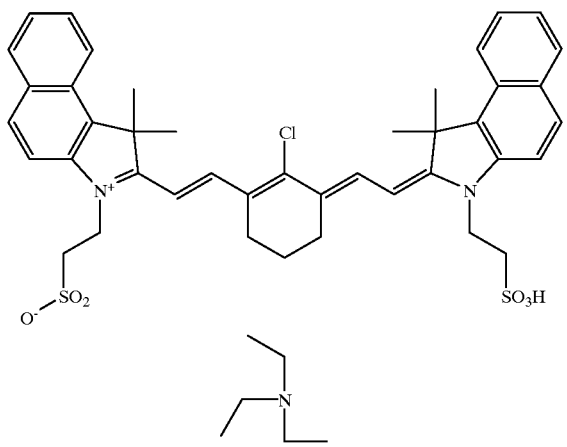

Preparation of the Lithographic Substrate

A 0.20 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m$^2$ to form a surface topography with an average center-line roughness Ra of 0.5 µm.

After rinsing with demineralized water the aluminum foil was etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 A/m$^2$ for about 300 seconds to form an anodic oxidation film of 3.00 g/m$^2$ of $Al_2O_3$, then washed with demineralized water, post treated with a solution containing polyvinylphosphonic acid and subsequently with a solution containing aluminum trichloride, rinsed with demineralized water at 20° C. during 120 seconds and dried.

Comparative Example 1

Preparation of the Heat-Mode Imaging Element

The lithographic substrate, prepared as described above, was mounted on a drum and rotated at a line speed of 164 m/min. The spray solution was coated by an air assisted spray nozzle type VAU (commercially available at Spraying Systems Belgium, Brussels) moving in transverse direction at a speed of 1.5 m/min. The spray nozzle was mounted on a distance of 60 mm from the lithographic substrate. The flow rate of the spray solution was set to 7 ml/min. During the spray process an air pressure of 90 psi was used on the spray head. The final coat weight was obtained by sequel spraying during 6 passes of the spray head. The obtained layer was dried at a temperature of 70° C. during the spraying process and additionally during 30 s.

Example 1

Preparation of the Heat-Mode Imaging Element

A lithographic substrate, prepared as described above, was mounted on a drum and rotated at a speed of 164 m/min.

The spray solution was jetted as a full plane by use of a continuous ink-jet printhead moving in transverse direction at a speed of 19.8 m/min. A comparable coating thickness as in comparative example 1 was obtained.

Test of Contamination Behavior

Test 1:

The ratio of applied coating to the substrate over the used amount of liquid was calculated. The thickness of the applied coating was measured by use of an optical densitometer. The amount of used spray liquid was measured after coating 10 plates.

Test 2:

During the application of the spray solution onto the lithographic substrate paper strips were attached above and beneath the spray nozzle. After 10 plates were sprayed, the color of the strips was compared with non used paper.

The results of the tests are listed in table 1

TABLE 1

| | Contamination behavior | |
|---|---|---|
| Example | Test 1 | Test 2 |
| 1 | 70% | colored |
| 2 | 100% | Not colored |

The results listed in table 1 show that there is no waste of spray solution and no contamination of the environment when the spray solution is applied onto the lithographic substrate with an ink-jet printhead.

What is claimed is:

1. A direct-to-plate method for making a lithographic printing plate comprising the steps of:

(a) applying a continuous layer of a radiation sensitive solution onto a lithographic substrate by means of an ink-jet printhead;

(b) image-wise exposing said layer;

(c) applying ink and fountain solution to the layer;

(d) removing ink accepting areas from the substrate by supplying a cleaning liquid;

(e) repeating steps (a) to (c) using the same substrate.

2. A method according to claim 1 wherein the ink-jet printhead is a continuous printing head.

3. A method according to claim 1 wherein said ink-jet printhead is a drop-on-demand printing head.

4. A method according to claim 3 wherein said drop-on-demand printing head is a piezo-electric printhead.

5. A method according to claim 1 wherein the radiation sensitive solution comprises hydrophobic thermoplastic polymer particles and a radiation-to-heat converting compound.

6. A method according to claim 1 wherein the substrate is a plate cylinder of a rotary printing press or a plate or a sleeve mounted on a plate cylinder of a rotary press.

7. A method according to claim 1 wherein the substrate is a flexible support coated with a crosslinked hydrophilic layer.

8. A method according to claim 1 wherein step (a) is carried out by means of an apparatus wherein said ink-jet printhead is mounted on a shuttle that is movable over said lithographic substrate.

9. A method according to claim 1 wherein step (a) is carried out by means of an apparatus wherein a non-shuttling ink-jet printhead is present.

10. A method according to claim 8 wherein the shuttle carries both the ink-jet printhead and a light source for image-wise exposing the layer.

* * * * *